United States Patent
Schreck

(10) Patent No.: US 7,333,846 B2
(45) Date of Patent: Feb. 19, 2008

(54) METHOD AND APPARATUS FOR FUNCTIONAL MAGNETIC RESONANCE IMAGING

(75) Inventor: Oliver Schreck, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 1003 days.

(21) Appl. No.: 10/072,039

(22) Filed: Feb. 5, 2002

(65) Prior Publication Data
US 2002/0107442 A1   Aug. 8, 2002

(30) Foreign Application Priority Data
Feb. 6, 2001 (DE) ............................ 101 05 387

(51) Int. Cl.
*A61B 5/055* (2006.01)
(52) U.S. Cl. .................. 600/410; 600/407; 600/411; 324/306; 324/307; 324/309
(58) Field of Classification Search ............... 600/410, 600/411, 413, 407, 425, 419; 324/307, 309, 324/306; 128/653.2; 607/45
See application file for complete search history.

(56) References Cited

U.S. PATENT DOCUMENTS

| | | | | |
|---|---|---|---|---|
| 5,565,777 A | | 10/1996 | Kanayama et al. | |
| 5,584,293 A | * | 12/1996 | Darrow et al. | 600/410 |
| 5,603,322 A | * | 2/1997 | Jesmanowicz et al. | 600/410 |
| 5,662,112 A | * | 9/1997 | Heid | 600/413 |
| 5,714,884 A | * | 2/1998 | Hoshino | 324/309 |
| 5,732,702 A | | 3/1998 | Mueller | |
| 5,771,893 A | * | 6/1998 | Kassai et al. | 600/419 |
| 6,002,254 A | | 12/1999 | Kassai et al. | |
| 6,018,675 A | * | 1/2000 | Apkarian et al. | 600/407 |
| 6,066,163 A | * | 5/2000 | John | 607/45 |
| 6,073,041 A | * | 6/2000 | Hu et al. | 600/410 |
| 6,298,258 B1 | | 10/2001 | Heid et al. | |
| 6,377,833 B1 | * | 4/2002 | Albert | 600/410 |
| 6,451,015 B1 | * | 9/2002 | Rittman et al. | 606/34 |
| 6,463,328 B1 | * | 10/2002 | John | 607/45 |
| 6,768,915 B2 | * | 7/2004 | Brand et al. | 600/410 |
| 2002/0103428 A1 | * | 8/2002 | deCharms | 600/410 |

* cited by examiner

*Primary Examiner*—Eleni Mantis Mercader
*Assistant Examiner*—Baisakhi Roy
(74) *Attorney, Agent, or Firm*—Schiff Hardin LLP

(57) ABSTRACT

In a method and a magnetic resonance apparatus for functional imaging, a number of images without and with a designational stimulation of the examination subject are sequentially registered in successive alternation, and an information value that indicates whether the image was registered during a phase with or without stimulation, at least one image-related stimulation value, and at least one image-related evaluation correlation value are obtained and stored for every image.

13 Claims, 1 Drawing Sheet

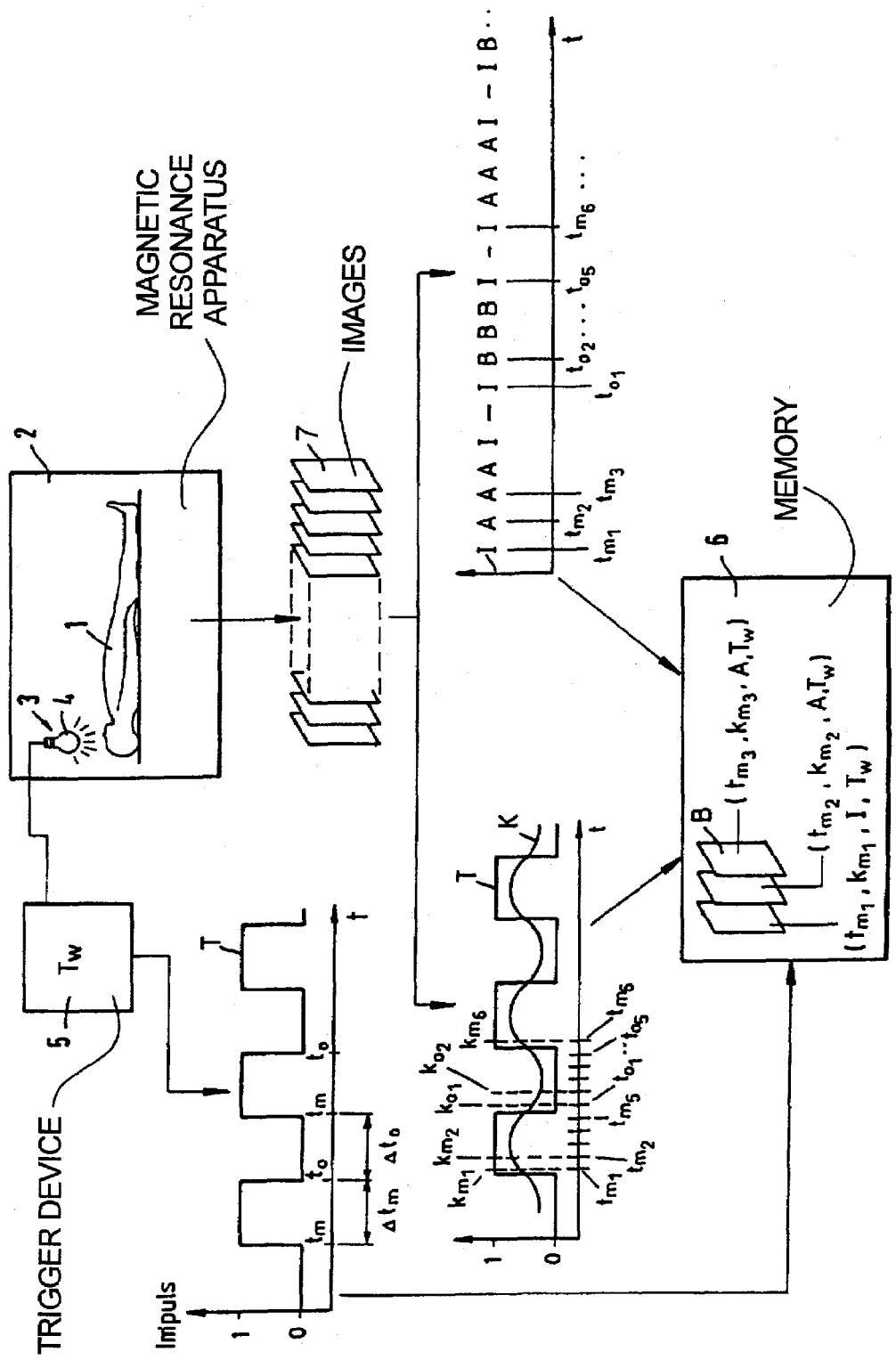

METHOD AND APPARATUS FOR FUNCTIONAL MAGNETIC RESONANCE IMAGING

BACKGROUND OF THE INVENTION

1. Field of the Invention

The present invention is directed to a method for the operation of a magnetic resonance apparatus for functional imaging, of the type wherein a number of images without and with a designational stimulation of the examination subject are sequentially registered in successive alternation.

2. Description of the Prior Art

Functional imaging offers the possibility of being able to examine and observe body or organ functions over a longer time span in order to obtain information about possible pathologies of the examination region. A number of image sequences are successively registered in alternation within the framework of these examinations, with a designational stimulation of the examination subject either being emitted or not emitted within the respective sequence. As a result of the designational stimulation, stimulation-dependent differences appear in the registered images, these differences being processed within the framework of the evaluation that ensues after the registration of a respective image. One example of an examination method for functional imaging is BOLD (blood oxygen level dependent) measurement using a magnetic resonance apparatus, whereby activity images of the brain of the patient are registered. For some of the measurements, the brain of the patient is thereby stimulated, for example as a result of finger movement, acousto-optical signals, electrical pulses, etc., whereas no stimulation ensues during the others of the measurements. The different measurements that are obtained in the framework of the evaluation are correlated with respect to an evaluation correlation value. A measure for the stimulation of defined brain areas of the patient are obtained from this evaluation, with the stimulated brain areas appearing in the evaluation image as clearly brighter regions.

In known methods, the evaluation ensues directly after a measurement or registration of an image. This evaluation is based on the relevant information known at this moment as to whether the respective image was registered with or without stimulation, possibly also with information relating to the stimulation as well as the respective evaluation correlation value. Problems arise, however, when a repeated evaluation is to ensue at a later point in time. It is not possible to exactly allocate the image-related, relevant information such as a stimulation phase underlying the registration as well as the information about the stimulation itself and the evaluation correlation value to the respective image.

SUMMARY OF THE INVENTION

An object of the present invention is to provide a functional imaging method and a magnetic resonance imaging apparatus that enable a later or repeated evaluation and, thus, an evaluation of the examination result at any time.

This object is inventively achieved in a method and apparatus of the type initially described wherein an information value that indicates whether the image was registered during a phase with or without stimulation, at least one image-related stimulation value, and at least one image-related evaluation correlation value, are stored for every image.

As a result of the inventive storage of all exposure-relevant and evaluation-relevant information for each image, the attending physician can undertake the first or repeated evaluation at an arbitrary, later point in time, since the physician has all relevant information available to him or her together with the image data set. The problems as to the exact allocation of the exposure-relevant and evaluation-relevant information to the images, as is the case in the prior art, do not exist in the inventive method due to the compulsory, storage-conditioned merging of the image data with these information.

As stimulation value, information describing the type and/or intensity and/or duration of the stimulation and/or the stimulation points in time can be inventively stored. Any information, thus, that has relevant content for the evaluation in any way whatsoever and that is to be taken into consideration in the framework of the evaluation can be employed as the stimulation value. For example, the brightness of the optical stimulation source, the volume of the acoustic stimulation source, the pressure the stimulation source exerts on the examination subject giving a contact stimulation, the pulse intensity of an electrical stimulation source or an operating parameter of the stimulation source that can be specified as a criterion can be employed as the stimulation value describing the intensity of the stimulation. Insofar as stimulation sources that allow a combined stimulation are used, (for example, an acousto-optical stimulation) of course combined stimulation values can also be stored. In addition, of course, there is the possibility of employing stimulation sources other than those mentioned as examples, or of storing stimulation values other than those described.

A time-related correlation curve is inventively employed for the evaluation, with a value of the correlation curve lying in the point-in-time of the respective image registration being employed as the evaluation correlation value. This correlation curve, which the examining physician selects as an ideal curve and which is subject to an initial evaluation during the image exposure, can be, for example, a sine curve with a time scale as the abscissa. The value of the correlation curve corresponding to the pont in time of the exposure is then determined for the respective exposure times of an image and is stored as evaluation correlation value. In this way, the time-related evaluation correlation value for each picture element of an image is obtained from the correlation curve, with the same correlation curve forming the basis for all picture elements of an image as well as for all images that are registered.

In addition to the stimulation phase, the information value also can indicate whether the respective image is an image to be ignored within the framework of the evaluation. It is definitely required to ignore, for example, the two first images and the two last images that are registered within a phase, within the framework of the evaluation, since the stimulation and response relationships of the examination region, for example of the brain, change within this time span, thus the image information obtained during that time probably does not contain any relevant informational content within the framework of the evaluation.

DESCRIPTION OF THE DRAWING

The single FIGURE is a schematic block diagram of a magnetic resonance imaging apparatus constructed and operating in accordance with the principles of the present invention.

DESCRIPTION OF THE PREFERRED EMBODIMENTS

The FIGURE schematically shows the executive sequence of the inventive method i.e., the operation of an inventive magnetic resonance apparatus. An examination subject 1 is shown that, for example, is located in a magnetic resonance apparatus 2. For example, the activity of the brain given an optical stimulation is to be investigated here. For this purpose, a stimulation source 3 in the form of a light source 4 is provided, the operation thereof being triggered via an external trigger device 5. The light source 4 is turned on and off in alternation according to the curve T. The on duration $\Delta t_m$ as well as the off duration $\Delta t_o$ respectively amount, for example, to 10 s.

A number of images within the different stimulation phases are now registered with the magnetic resonance apparatus 2. In the illustrated example, respectively five images 7 are registered per phase, i.e. with a given stimulation as well as without stimulation. The image exposure is triggered corresponding to the time triggering of the stimulation source. This makes it possible to allocate an information value with respect to the respective stimulation phase within which the image 7 was registered to each image 7. In addition, the information value can be used to indicate whether the respectively registered image is to be ignored or not within the framework of the evaluation. In the illustrated example, the information value sequence reads "IAAAI-IBBBI-IAAAI- . . . ", whereby A=actively stimulated phase, B=non-stimulated phase, I=ignore image. Of the five images registered per phase, thus, the first and last are not taken into consideration in the evaluation; the three remaining images are evaluated.

As stated, the exposure of the images 7 is triggered dependent on the stimulation. In the illustrated exemplary embodiment, five images are registered per stimulation phase, at the times $t_{m1}, t_{m2}, \ldots, t_{m5}, t_{o1}, t_{o2}, \ldots, t_{o5}, t_{m6}, t_{m7}, \ldots$ ($t_m$=with stimulation; $t_o$=without stimulation). A first evaluation, further, ensues after the registration of each individual image 7. In the framework thereof, each individual image and, within this individual image, each individual picture element is correlated with reference to a correlation curve K. The correlation curve K is determined by the examining physician before the measurement. In the illustrated example, the correlation is implemented on the basis of a sinusoidal correlation curve K since the brain does not supply a discontinuous reply to an external stimulus but rises slowly up to a maximum of approximately 2 sec and then likewise requires a certain time upon shut-off until the signal has decayed. Within the framework of the evaluation, a corresponding, time-related evaluation correlation value $k_{m1}, k_{m2}, \ldots, k_{m5}, k_{o1}, k_{o2}, \ldots, k_{o5}, k_{m6}, \ldots$ is selected for each exposure time $t_{m1}, t_{m2}, \ldots, t_{o1}, t_{o2}, \ldots$ regardless of the phase. The evaluation then supplies a value that represents a criterion for the difference that the respective picture element signal exhibits with reference to the value of the correlation curve. A statistical evaluation thus ensues with reference to the images registered within the measurement (for example, 100 images overall can be registered within a measurement; of course, more images can also be registered), an overall image being present at the end of the statistical evaluation that shows the active zone of the brain. The active zones of the are brain derived statistically by taking the differences inherent in the picture elements into consideration over the total number of registered images. The stimulated brain zones are revealed within the final image on the basis of clearly brighter areas.

Finally, each individual image 7 and a family of information related thereto are stored in a memory area 6 of the magnetic resonance apparatus 2, these enabling a later evaluation of the image series since the operating, stimulation and evaluation parameters undertaken by the examining physician during the measurement and the initial evaluation are known per individual image. In the illustrated example, the exposure point in time $t_{m1}$, the correlation value $k_{m1}$ related to the exposure point in time, the phase information value I as well as the stimulation value $T_w$ (for example, the brightness of the light source 4) are stored for the first image 7. The exposure point in time $t_{m2}$, the correlation value $k_{m2}$, the phase information value A and the stimulation value $T_w$ are stored to the second registered image, etc.

Of course, it is also possible to store further image-related information per image insofar as these are relevant for a subsequent evaluation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance apparatus for functional imaging, comprising the steps of:
    obtaining a plurality of images, each comprised of picture elements, of a subject in a sequence and alternatingly obtaining the plurality of images within said sequence with stimulation of said subject and without stimulation of said subject; and
    storing each image in said plurality of images together with information independent of said picture elements indicating whether that image was registered with or without stimulation of said subject and together with at least one image-related stimulation value that is independent of said picture elements, and together with at least one image-related evaluation correlation value that is independent of said picture elements, said correlation value comprising a point on a time-related correlation curve coinciding with a point in time of the acquisition of the image stored with the image-related evaluation correlation value.

2. A method as claimed in claim 1 comprising selecting said image-related stimulation value from the group consisting of information describing a type of said stimulation, information describing an intensity of said stimulation, information describing a duration of said stimulation, and information describing a point in time of said stimulation.

3. A method as claimed in claim 1 wherein said at least one image-related stimulation value comprises information describing an intensity of said stimulation, said information being selected from the group consisting of a brightness of an optical stimulation source which produces said stimulation, a volume of an acoustic stimulation source which produces said stimulation, a pressure of a pressure-exerting stimulation source which produces said stimulation, a pulse intensity of an electrical stimulation source which produces said stimulation, and an operating parameter of a stimulation source that produces said stimulation.

4. A method as claimed in claim 1 comprising the additional step of evaluating said image in combination with said information, and wherein said plurality of images includes at least some images which should be ignored in said evaluation, and wherein said information further comprises an identification of whether the image stored with the information is an image which should be ignored in said evaluation.

5. A magnetic resonance apparatus for functional imaging, comprising:

a magnetic resonance scanner with a sensory stimulator obtaining a plurality of images, each comprised of picture elements, of a subject in a sequence and alternatingly obtaining the plurality of images within said sequence with sensory stimulation of said subject and without sensory stimulation of said subject; and a memory storing each image in said plurality of images together with information. independent of said picture elements indicating whether that image was registered with or without stimulation of said subject and together with at least one image-related stimulation value, that is independent of said picture elements and together with at least one image-related evaluation correlation value that is independent of said picture elements, said correlation value comprising a point on a time-related correlation curve coinciding with a point in time of the acquisition of the image stored with the image-related correlation value.

6. A magnetic resonance apparatus for functional imaging as claimed in claim 5 wherein said image-related stimulation value is a value selected from the group consisting of information describing a type of said stimulation, information describing an intensity of said stimulation, information describing a duration of said stimulation, and information d describing a point in time of said stimulation.

7. A magnetic resonance apparatus for functional imaging as claimed in claim 5 wherein said at least one image-related stimulation value comprises information describing an intensity of said sensory stimulation by said sensory stimulator.

8. A magnetic resonance apparatus for functional imaging as claimed in claim 5 wherein said sensory stimulator is an optical stimulation source, and wherein said at least one image-related stimulation value represents a brightness of light emitted by said optical stimulation source.

9. A magnetic resonance apparatus for functional imaging as claimed in claim 5 wherein said sensory stimulator is an acoustic stimulation source, and wherein said at least one image-related stimulation value represents a volume of sound emitted by said acoustic stimulation source.

10. A magnetic resonance apparatus for functional imaging as claimed in claim 5 wherein said sensory stimulator is a pressure-exerting stimulation source, and wherein said at least one image-related stimulation value represents a pressure exerted by said pressure-exerting stimulation source.

11. A magnetic resonance apparatus for functional imaging as claimed in claim 5 wherein said sensory stimulator is an electrical stimulation source, and wherein said at least one image-related stimulation value represents a pulse intensity of an electrical pulse emitted by said electrical stimulation source.

12. A magnetic resonance apparatus for functional imaging as claimed in claim 5 wherein said sensory stimulator has an operating parameter associated therewith, and wherein said at least one image-related stimulation value represents said operating parameter.

13. A magnetic resonance apparatus for functional imaging as claimed in claim 5 further comprising a processor evaluating said image in combination with said information, and wherein said plurality of images includes at least some images which should be ignored in said evaluation, and wherein said information further comprises an identification of whether the image stored with the information is an image which should be ignored by said processor in said evaluation.

* * * * *